(12) United States Patent
Klauk et al.

(10) Patent No.: US 6,806,124 B2
(45) Date of Patent: *Oct. 19, 2004

(54) METHOD FOR REDUCING THE CONTACT RESISTANCE IN ORGANIC FIELD-EFFECT TRANSISTORS BY APPLYING A REACTIVE INTERMEDIATE LAYER WHICH DOPES THE ORGANIC SEMICONDUCTOR LAYER REGION-SELECTIVELY IN THE CONTACT REGION

(75) Inventors: Hagen Klauk, Erlangen (DE); Günter Schmid, Hemhofen (DE); Tarik Kriem, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/285,049

(22) Filed: Oct. 31, 2002

(65) Prior Publication Data

US 2003/0092232 A1 May 15, 2003

(30) Foreign Application Priority Data

Oct. 31, 2001 (DE) .......................................... 101 53 656

(51) Int. Cl.[7] .............................................. H01L 21/00
(52) U.S. Cl. ...................... 438/149; 438/99; 438/602; 257/40
(58) Field of Search ................................. 438/149, 158, 438/99, 780, 690; 257/40, 99, 410–411, 408, 396

(56) References Cited

U.S. PATENT DOCUMENTS 6,433,359 B1 * 8/2002 Kelley et al. ................. 257/40
2002/0022307 A1 * 2/2002 Park et al. .................. 438/149

OTHER PUBLICATIONS

Hagen Klauk et al.: "A reduced complexity process for organic thin film transistors", *Applied Physics Letters*, vol. 76, No. 13, Mar. 27, 2000, pp. 1692–1694.

* cited by examiner

*Primary Examiner*—Dung A. Le
(74) *Attorney, Agent, or Firm*—Laurence A. Greenberg; Werner H. Stemer; Gregory L. Mayback

(57) ABSTRACT

A semiconductor device is fabricated and contains a first body made of an organic semiconductor material and a second body made of an electrically conductive contact material, that form a common contact area. First, a body is produced on a substrate, which body may be composed of the contact material or the organic semiconductor material, and an intermediate layer is applied thereon, the intermediate layer containing a reactive dopant. Afterward, a body made of the organic semiconductor material or the contact material is fabricated on the intermediate layer. The dopant contained in the intermediate layer effects a region-selective doping of the organic semiconductor material and, as a consequence, a significant reduction of the contact resistance for the transition of charge carriers between the contact material and the organic semiconductor material.

13 Claims, 4 Drawing Sheets

METHOD FOR REDUCING THE CONTACT RESISTANCE IN ORGANIC FIELD-EFFECT TRANSISTORS BY APPLYING A REACTIVE INTERMEDIATE LAYER WHICH DOPES THE ORGANIC SEMICONDUCTOR LAYER REGION-SELECTIVELY IN THE CONTACT REGION

BACKGROUND OF THE INVENTION

Field of the Invention

The invention relates to a method for fabricating a semiconductor device containing at least one first body and a second body, which form a common contact area. One of the bodies is constructed from an organic semiconductor material and the other body is constructed from an electrically conductive contact material. The method according to the invention makes it possible to significantly reduce the contact resistance in the transition of charge carriers from the first body into the second body.

Field-effect transistors are used as switches in electronic circuits. A semiconductor disposed between a source electrode and a drain electrode constructed from electrically conductive material in each case acts as an insulator in the switched-off state of the transistor, while a charge carrier channel forms under the influence of the field of a gate electrode in the switched-on state of the transistor. In this case, electrical charge carriers are injected into the semiconductor layer at the source contact and extracted from the semiconductor layer at the drain contact, so that an electric current flows from source to drain through the semiconductor layer or through the charge channel produced in the semiconductor layer.

Owing to the different Fermi levels of semiconductor material and contact material, an asymmetrical diffusion process occurs at the contact area of the two materials. The different energy of the Fermi levels of the two materials gives rise to an energy difference, which is compensated for by the crossing of charge carriers. As a consequence, an interface potential builds up which, when an external potential difference is applied, counteracts crossing of the charge carriers between the two layers. A potential barrier is thus produced, which has to be surmounted by the charge carriers when entering into the semiconductor material from the electrically conductive contact or when emerging from the semiconductor material into the electrically conductive contact. In this case, the tunneling current produced as a result of the charge carriers tunneling through the potential barrier is smaller, the higher or wider the potential barrier. A low tunneling current corresponds to a high contact resistance.

In semiconductor components based on inorganic semiconductors, an increase in the contact resistance is combated by doping the inorganic semiconductor in a boundary layer oriented toward the contact area. The doping alters the energy of the Fermi level in the inorganic semiconductor, i.e. the difference between the Fermi levels of contact material and semiconductor material decreases. As a consequence, either the potential barrier is reduced, thereby enabling a significantly larger number of charge carriers to surmount the potential barrier and to flood the material opposite, or the potential barrier is narrowed, as a result of which the probability of charge carriers tunneling through the potential barrier increases. In both cases, the contact resistance is reduced.

In the fabrication of field-effect transistors based on amorphous or polycrystalline silicon layers, the contact regions are doped by the introduction of phosphorus or boron into the silicon layer near the source and drain contacts. The phosphorus or boron atoms are incorporated into the silicon network and act as charge donors or charge acceptors, thereby increasing the density of the free charge carriers and thus the electrical conductivity of the silicon in the doped region. This reduces the difference between the Fermi levels of contact material and doped semiconductor material. In this case, the doping substance is introduced into the silicon only in the region of the source and drain contacts, but not in the channel region in which a charge carrier channel forms under the influence of the field of the gate electrode. Since phosphorus and boron form covalent bonds with the silicon, there is no risk of the atoms diffusing into the channel region, so that a low electrical conductivity in the channel region is furthermore guaranteed.

If the doping of the contact regions is high enough, the tunneling probability is already so high in the quiescent state that the junction between the contact material and the inorganic semiconductor material loses its blocking capability and becomes readily conductive in both directions.

Field-effect transistors based on organic semiconductors are of interest for a multiplicity of electronic applications that require extremely low manufacturing costs, flexible or unbreakable substrates, or the fabrication of transistors and integrated circuits over large active areas. By way of example, organic field-effect transistors are suitable as pixel control elements in active matrix screens. Such screens are usually fabricated with field-effect transistors based on amorphous or polycrystalline silicon layers. The temperatures of usually more than 250° C. that are necessary for fabricating high-quality transistors based on amorphous or polycrystalline silicon layers require the use of rigid and fragile glass or quartz substrates. By virtue of the relatively low temperatures at which transistors based on organic semiconductors are fabricated, usually of less than 100° C., organic transistors allow the fabrication of active matrix screens using inexpensive, flexible, transparent, unbreakable polymer films, with considerable advantages over glass or quartz substrates.

A further area of application for organic field-effect transistors is the fabrication of highly cost-effective integrated circuits, as are used for example for the active marking and identification of merchandise and goods. These so-called transponders are usually fabricated using integrated circuits based on monocrystalline silicon, which leads to considerable costs in the construction and connection technology. The fabrication of transponders on the basis of organic transistors would lead to huge cost reductions and could help the transponder technology to achieve worldwide success.

One of the main problems in the application of organic field-effect transistors is the relatively poor electrical properties of the source and drain contacts, i.e. the high contact resistances thereof. The source and drain contacts of organic transistors are usually produced using inorganic metals or with the aid of conductive polymers, in order thus to ensure the highest possible electrical conductivity of the contacts. Most organic semiconductors that are appropriate for use in organic field-effect transistors have very low electrical conductivities. By way of example, pentacene, which is often used for fabricating organic field-effect transistors, has a very low electrical conductivity of $10^{-14}$ $\Omega^{-1}\text{cm}^{-1}$. If the organic semiconductor has a low electrical conductivity, a large difference between the Fermi levels of the electrically conductive contact material and the organic semiconductor material therefore exists at the contact area. This leads to the formation of a high potential barrier with a low tunneling probability for the passage of electrons. Therefore, source and drain contacts often have very high contact resistances, which has the effect that high electrical field strengths are necessary at the contacts in order to inject and extract charge carriers. A restrictive effect is thus brought about not by the conductivity of the contacts themselves, but by the conductivity of the semiconductor regions that adjoin the contacts and into or from which the charge carriers are injected or extracted.

In order to improve the electrical properties of the source and drain contacts, therefore, a high electrical conductivity of the organic semiconductor in the regions adjoining the contacts is desirable in order to reduce the difference in the Fermi levels between the organic semiconductor and the contact material and thus to lower the contact resistances. On the other hand, a high electrical conductivity of the organic semiconductor in the channel region adversely influences the properties of the transistor. An appreciable electrical conductivity in the channel region inevitably leads to high leakage currents, that is to say to relatively high electric current intensities in the switched-off state of the field-effect transistor. For many applications, however, low leakage currents in the region of $10^{-12}$ A or less are indispensable. Moreover, a high electrical conductivity has the effect that the ratio between maximum switch-on current and minimum switch-off current turns out to be too small. Many applications require the largest possible ratio between switch-on current and switch-off current in the region of $10^7$ or greater, since this ratio reflects the modulation behavior and the gain of the transistor. Therefore, a low electrical conductivity of the organic semiconductor is necessary in the channel region, while a high electrical conductivity is necessary in the region of the source and drain contacts, in order to improve the contact properties between organic semiconductor material and the material of the contacts.

As in the case of inorganic semiconductors, the electrical conductivity of many organic semiconductors can be increased by the introduction of suitable doping substances. Obtaining positional selectivity in the course of doping is problematic, however. The doping substances are not bound to a specific position in the organic semiconductors and can move freely within the material. Even if the doping process can originally be restricted to a specific region, for example the regions around the source and drain contacts, the doping substances later migrate through the entire organic semiconductor layer, in particular under the influence of the electric field applied between the source and drain contacts in order to operate the transistor. The electrical conductivity in the channel region is inevitably increased by the diffusion of the doping substances within the organic semiconductor layer.

SUMMARY OF THE INVENTION

It is accordingly an object of the invention to provide a method for reducing the contact resistance in organic field-effect transistors by applying a reactive intermediate layer that dopes the organic semiconductor layer region-selectively in the contact region, that overcomes the above-mentioned disadvantages of the prior art methods of this general type, that makes it possible to significantly lower the contact resistance in the transition of charge carriers from an electrically conductive material into an organic semiconductor material.

With the foregoing and other objects in view there is provided, in accordance with the invention, a method for fabricating a semiconductor device. The method includes the steps of providing a first body, providing a dopant on at least one section of an area of the first body, and depositing a second body on the section of the area of the first body resulting in a formation of a contact area. One of the first and second bodies is formed from an organic semiconductor material and the other of the first and second bodies is formed from an electrically conductive contact material. A region-selective doping is introduced at the contact area by the dopant into regions of the organic semiconductor material adjoining the contact area.

In the case of the method according to the invention, a dopant is provided on an area that later forms the contact area between the contact material and the organic semiconductor material, and the contact area is formed by deposition of the second body. As a result, the organic semiconductor material is doped only in the regions of the organic semiconductor material which directly adjoin the contact area, while the remaining regions of the organic semiconductor material do not experience a doping and thus retain their low electrical conductivity. Thus, the conductivity of the organic semiconductor material is increased only in the regions of the organic semiconductor material that are essential for the charge crossing from the electrically conductive contact material into the organic semiconductor material or from the organic semiconductor material into the electrically conductive contact material. The doping reduces the width of the potential barrier that has to be surmounted by the charge carriers when crossing from one body into the other body. This also increases the probability of the charge carriers tunneling through the potential barrier, so that a larger tunneling current flows, which corresponds to a lower contact resistance. The desired low electrical conductivity is maintained in the remaining regions of the organic semiconductor material, so that leakage currents are kept as small as possible. Thus, the contact resistance at the contact area is lowered, while the low electrical conductivity of the organic semiconductor material is maintained in the undoped regions.

The organic semiconductor material is not inherently subject to any restrictions. It must merely have semiconductor properties, that is to say have a low electrical conductivity, for example, in the switched-off state of an organic field-effect transistor, while it forms a conduction channel, that is to say becomes electrically conductive, under the influence of the field generated by the gate electrode. Examples of suitable compounds that can be used are polyenes, such as anthracene, tetracene or pentacene, polythiophenes or oligothiophenes, and their substituted derivatives, polypyrroles, poly-p-phenylenes, poly-p-phenylvinylidenes, naphthalenedicarboxylic dianhydrides, naphthalene-bisimides, polynaphthalenes, phthalocyanines, copper phthalocyanines or zinc phthalocyanines and their substituted, in particular fluorinated, derivatives.

All materials that have a sufficiently high electrical conductivity are suitable as a contact material. In principle, all metals are suitable, preferably palladium, gold, platinum, nickel, copper, aluminum, and also electrically conductive oxides, such as, for example, ruthenium oxide and indium tin oxide, and also electrically conductive polymers, such as polyacetylene or polyaniline.

The embodiment of the method can take two routes, in principle, the first body being composed of the electrically conductive contact material in the case of the first route and of the organic semiconductor material in the case of the second route. Thus, the dopant can on the one hand be provided on the electrically conductive contact material on which a layer of the organic semiconductor material is subsequently applied. However, it is equally possible first to produce a body made of the organic semiconductor material and to provide the dopant on a section that corresponds to the later contact area, in order subsequently to apply the electrically conductive contact material, the contact area being formed. In the last-mentioned method variant, dopant and electrically conductive contact material are preferably applied in a common work step.

The dopant is preferably applied as a layer on the area of the first body. Depending on the method implementation, the first body is constructed from the organic semiconductor material or from the electrically conductive contact material. Depending on the dopant used, the latter can be applied as a substance, for example by vapor deposition or spreading on, or preferably dissolved in a solvent. In this case, the solvent is chosen such that it does not react with the dopant, does not dissolve the materials used for fabricating the semiconductor device, and is readily volatile. The solution of the dopant can be applied by customary methods. By way of example, the solution can be applied to the electrically conductive contact material or to the organic semiconductor material by spin-on, spraying on, pouring or printing. The dopant is applied in such a way that it covers the sections of the area of the first body that form the contact areas after completion. Section-by-section application of the dopant can be carried out for example with the aid of a mask, only the sections on which the dopant is to be applied being uncovered. The solvent is subsequently evaporated, for example by heating, so that a thin layer of the dopant remains on the surface of the first body. The thickness of the layer of the dopant can be chosen to be very small. In a preferred embodiment the layer is embodied as a monomolecular layer.

The doping can also be introduced into the organic semiconductor material in such a way that first the first body is provided from the electrically conductive contact material, then at least one section of the area of the first body is activated, and then the second body is deposited, from the organic semiconductor material, on at least the section of the area of the first body, in order to form the contact area between the first and second bodies. The activated sections of the area of the first body introduce a region-selective doping into regions of the organic semiconductor material that adjoin the contact area. Thus, by way of example, it is possible to fabricate a first body made of indium tin oxide and, after the deposition, to convert the indium tin oxide at the surface of the first body in an oxygen plasma to form a material with an increased proportion of oxygen. The organic semiconductor layer that is subsequently deposited as the second body reduces the contact material indium tin oxide to form a thermodynamically stable stage and is itself oxidized in the process, which leads to a region-selective doping of the organic semiconductor layer in the regions adjoining the contact area. Instead of indium tin oxide, it is also possible to use, for example, noble metals, such as silver, gold, palladium, platinum or copper, whose oxides readily oxidize the organic semiconductor layer. Activation can also be effected using other materials, for example by halogenation with fluorine, chlorine, bromine or iodine or the metal complexes thereof, such as $PtF_x$. It is likewise possible to nitrate the area of the electrically conductive contact material, for example by vapor deposition of $Co(NO_3)_2$.

It is also possible to dope the organic semiconductor material in the regions adjoining the contact area by interdiffusion. In this embodiment of the method according to the invention, the body constructed from the electrically conductive contact material contains the dopant, which, in this case may also be distributed in the entire volume of the body and dopes the electrically conductive contact material. After the formation of the contact area, the dopant diffuses from the electrically conductive contact material into the regions of the organic semiconductor material that adjoin the contact area, and effects a region-selective doping there. In this embodiment, the method can be carried out in such a way that the first body is fabricated from the electrically conductive contact material doped with the dopant, on which material the second body made of the organic semiconductor material is then deposited. However, it is also possible to fabricate the first body from the organic semiconductor material and then to deposit on the latter the doped electrically conductive contact material as the second body. In this method variant, the area on which the dopant is provided is produced at the same time as the body made of the doped electrically conductive contact material.

In this case the dopant is preferably configured in such a way that a doping is effected only in a narrow region of the organic semiconductor material that adjoins the contact area. To that end, in accordance with a preferred embodiment, the dopant may be an acid and the contact material may have strongly basic properties. By way of example, the contact material may be composed of polyaniline that is doped with camphor sulfonic acid for increasing the electrical conductivity. The organic semiconductor material used is a thiophene functionalized with amino groups, which has no doping. Through slight interdiffusion of the camphor sulfonic acid, the organic semiconductor material is doped in the region of the contact area. Owing to the strong basicity of the polyaniline, the diffusion stops after a few monolayers. Therefore, the remaining regions of the organic semiconductor material are not influenced by the doping.

The dopant must effect a chemical alteration and thus a doping in the region of the organic semiconductor material that adjoins the contact area. The doping can be effected in various ways. Thus, the dopant used may be a protonic acid or a base which protonates or deprotonates the organic semiconductor material with salt formation. Thus, by way of example, it is possible to fabricate a first body that contains polyaniline as electrically conductive contact material, which is doped with camphor sulfonic acid for increasing the electrical conductivity. A thin layer of polysulfonic acid is subsequently applied in the region of the contact area. If an organic semiconductor layer is subsequently applied to the contacts made of electrically conductive polyaniline, the organic semiconductor material is doped in the contact region.

The dopant can also act as an oxidizing agent or as a reducing agent that oxidizes or reduces the organic semiconductor material. Oxidation is suitable when using organic p-type semiconductors, and reduction is suitable when using organic n-type semiconductors. A doping by oxidation can be achieved for example if a functionalized benzoyl peroxide or AIBN (azoisobutyro-nitrile) is used as the dopant.

In accordance with a further embodiment, the dopant has complexing properties. To that end, the layer of dopant that is applied to the first body contains metal atoms to which the organic semiconductor material can bond coordinatively. By way of example, if the first body is composed of a contact material, then first an iron(III) complex is applied thereto as dopant. In this case, the iron(III) complex can be applied as a layer or else be bonded as a monolayer on the surface of the first body by corresponding ligands. A layer made of polythiophene is subsequently applied as second body. The sulfur atoms of the thiophene can then bond coordinatively to the iron(III) atoms. As a result of the complexing, the charge density of the thiophene is partly transferred to the Lewis acid iron(III). The charge transfer effects a doping. Essentially all positively charged complexes of the transition metals or of the lanthanoids and actinoids are suitable for this purpose. If the charge is transferred completely from the thiophene to the metal ion, this effects an oxidation of the semiconductor and thus a doping, while the metal ion is reduced, for example Fe(III) to Fe(II). If pentacene is used as organic semiconductor, derivatives of bis(rhodium(II)) trifluoroacetate or of bis(rhodium(II)) acetate are suitable, for example.

In accordance with a further preferred embodiment the dopant forms a covalent bond with the organic semiconductor material. To that end, both the dopant and the organic semiconductor material have a reactive group, and the reactive groups can react with one another to form a covalent bond. To that end, an intermediate layer can be deposited which forms a charge transfer complex with the organic semiconductor layer, or reacts further directly to form a doped compound. By way of example, a tricyanoethylene functionalized with thiol groups can be deposited on a palladium contact in the form of a self-organized monolayer. After deposition of pentacene from the gas phase as the organic semiconductor layer, a color intensification is visible at the contacts, which partly disappears. First a charge transfer complex is produced, which is then partly eliminated in a Diels-Alder reaction. As a result, the dopants are fixed not only by the thiol group but also on the side of the organic semiconductor layer in the region of the contact area.

For the method according to the invention, it is essential that, on the one hand, the dopant is provided during the fabrication of the semiconductor device in sections which correspond to the contact areas in the completed semiconductor device, and, on the other hand, in the completed semiconductor device, the doping remains in the regions of the organic semiconductor material which adjoin the contact area and does not diffuse into the more remote regions of the organic semiconductor material and lead to an increase in the electrical conductivity there.

In a preferred embodiment, therefore, the dopant has a group with which the dopant can coordinate to the sections of the area of the body that is constructed from the electrically conductive contact material. A group suitable for the coordination to metals is the thiol group, for example. In this embodiment, the dopant is preferably at least bifunctional, that is to say contains a functional group that can bind to the surface of the electrically conductive contact material, and a functional group that effects the doping of the organic semiconductor material. Such a group may be e.g. a group that is capable of salt formation and forms a salt with the organic semiconductor material. The salt formation may be effected e.g. by the organic semiconductor material being protonated or deprotonated.

The method can also be carried out in such a way that the dopant is first fixed by complexing on the area of the body that is composed of the electrically conductive contact material. The body preferably corresponds to the first body. In this embodiment, an at least bifunctional ligand is applied to at least the sections of the area of the body which is constructed from the electrically conductive contact material, the ligand having a functional group for coordination to the area of the body which is constructed from the electrically conductive contact material, and a functional group which coordinates to the dopant, and the dopant coordinating to the bifunctional ligand. The dopant is then fixed by the at least bifunctional ligand on at least the sections of the area of the body made of the electrically conductive contact material and is available for a doping of the organic semiconductor material. Thus, by way of example, a monolayer of a dithiol can be deposited on at least the sections of the area of the body made of the electrically conductive contact material by dipping into a corresponding solution. After a rinsing step, the deposited monolayer is treated with iron(III) ions. The terminal thiol groups fix the iron(III) ions in the contact region. After deposition of the organic semiconductor layer, the organic semiconductor is oxidatively doped in the contact region.

The method according to the invention is particularly suitable for the fabrication of organic field-effect transistors. In this case, the semiconductor device is part of an organic field-effect transistor that contains a source electrode and a drain electrode and a path made of an organic semiconductor material which is disposed between source and drain electrodes, the source electrode and/or the drain electrode forming the body constructed from the electrically conductive material and the path made of the organic semiconductor material forming the body constructed from the organic semiconductor material.

Other features which are considered as characteristic for the invention are set forth in the appended claims.

Although the invention is illustrated and described herein as embodied in a method for reducing the contact resistance in organic field-effect transistors by applying a reactive intermediate layer which dopes the organic semiconductor layer region-selectively in the contact region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
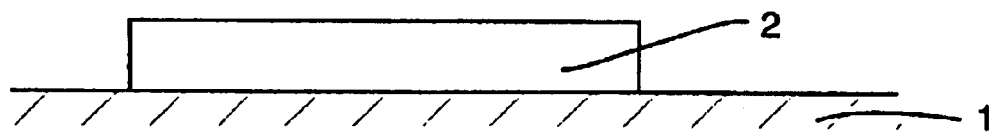
FIGS. 1A–1D are diagrammatic, sectional views showing a sequence of method steps that are performed when carrying out a method according to the invention.
Figure 1B:
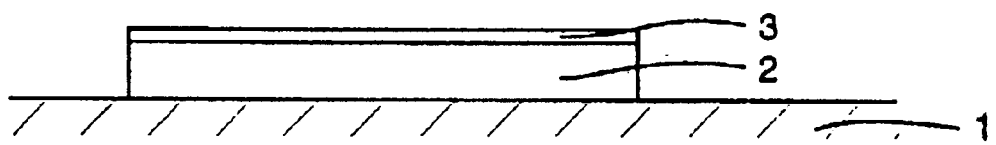
Figure 1C:
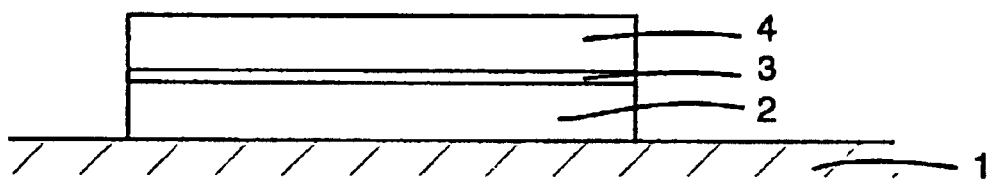
Figure 1D:
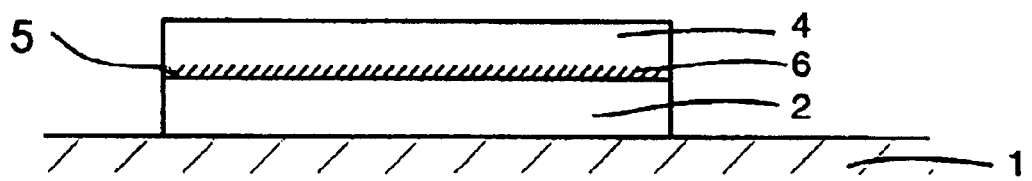

Referring now to the figures of the drawing in detail and first, particularly, to FIGS. 1A–1D thereof, there is shown a sequence of method steps which are performed when carrying out a method according to the invention. First, as shown in FIG. 1A, a first body 2 is provided on a substrate 1. What is used as the substrate 1 is preferably inexpensive, flexible polymer films based on polyethylene naphthalate, polyehtylene-terephthalate, polyethylene, polypropylene, poly-styrene, epoxy resin, polyimides, polybenzoxazoles, polyethers, or their electrically conductively coated variants and also flexible metal foils, glass, quartz, or electrically conductively coated glasses. Depending on the method implementation, the first body 2 may be composed of an organic semiconductor material or an electrically conductive contact material. An intermediate layer 3 containing a dopant is subsequently deposited on the first body 2 (FIG. 1B). If the first body 2 is composed of the organic semiconductor material, the organic semiconductor material can be directly doped. A second body 4 is subsequently applied to the intermediate layer 3 illustrated in FIG. 1B, thereby obtaining the configuration illustrated in FIG. 1C. If the second body 4 is composed of the organic semiconductor material, the organic semiconductor material is doped in a region 6 adjacent to a contact area 5 formed between the bodies 2, 4, while the rest of the regions of the organic semiconductor material remain undoped. This configuration is shown diagrammatically in FIG. 1D.

Figure 2A:
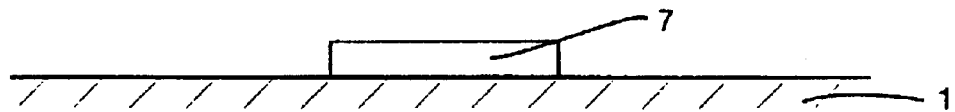
FIGS. 2A–2E are sectional views showing a sequence of the method steps that are performed when fabricating an organic field-effect transistor.
Figure 2B:
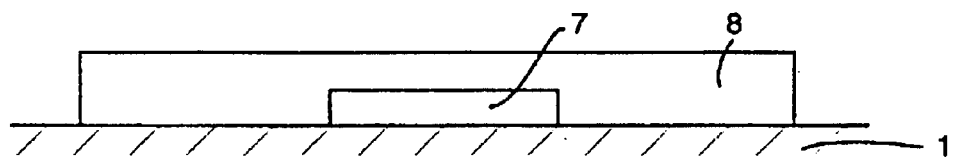
Figure 2C:
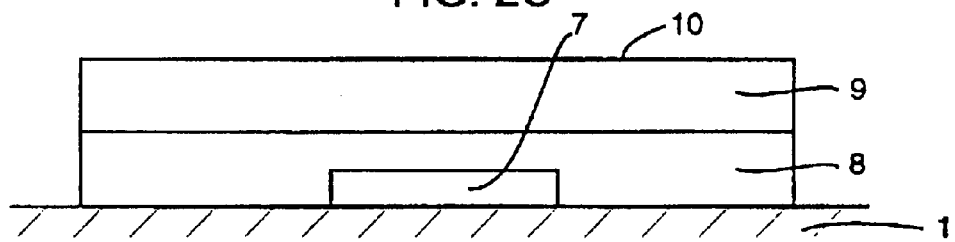
Figure 2D:
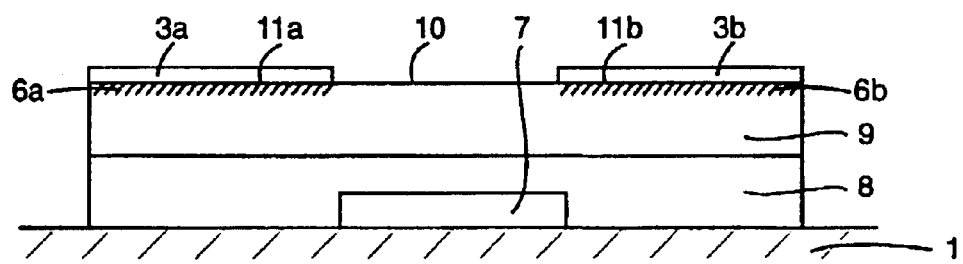
Figure 2E:
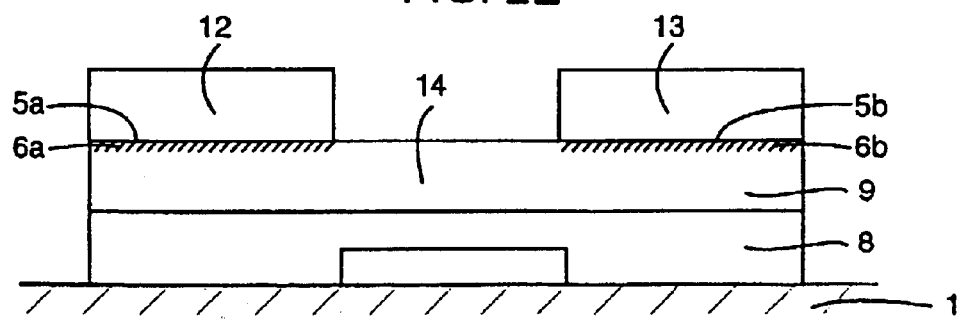

Using the example of the fabrication of an organic field-effect transistor, FIGS. 2A–2E diagrammatically illustrate the work steps which are performed when carrying out the method according to the invention. First, as illustrated in FIG. 2A, a gate electrode 7 is defined on the substrate 1. What is used as the substrate 1 are preferably the materials described for FIG. 1. The gate electrode 7 is composed of a conductive material, in particular a conductive metal, for example aluminum, and can be deposited e.g. by vapor deposition. Afterward, as illustrated in FIG. 2B, the gate electrode 7 is insulated with a gate dielectric 8. By way of example, silicon dioxide or a nonconductive polymer can be used for this purpose. A layer 9 made of an organic semiconductor material is subsequently deposited on the gate dielectric 8. In the configuration shown in FIG. 2C, the layer 9 of the organic semiconductor material has an uncovered area 10. On the area 10 of the layer 9 made of the organic semiconductor material, a thin intermediate layer 3a, 3b containing a dopant is subsequently deposited in sections 11a, 11b which later form contact areas 5a, 5b. The dopant dopes the layer 9 made of the organic semiconductor material in the regions 11a, 11b adjacent to the contact areas 5a, 5b. Finally, contacts in the form of a source electrode 12 and a drain electrode 13 are deposited, which are preferably composed of a metal, in particular aluminum. The doping has taken place only in regions 6a, 6b at the contact areas 5a, 5b while a channel region 14, in which a charge carrier channel is produced under the action of the field generated by the gate electrode 7, remains free of dopings.

FIGS. 3A–3E show cross-sectional views through further embodiments of the field-effect transistor which can be fabricated by the method according to the invention and contain the semiconductor configuration according to the invention. The intermediate layers 3a, 3b containing the dopant were deposited on sections of the area of the organic semiconductor layer 9 during the fabrication of the field-effect transistor in the case of the configurations illustrated in FIGS. 3A and 3B while the intermediate layers containing the dopant were deposited on the contacts in the case of the configurations shown in FIGS. 3C, 3D and 3E.

Figure 3A:
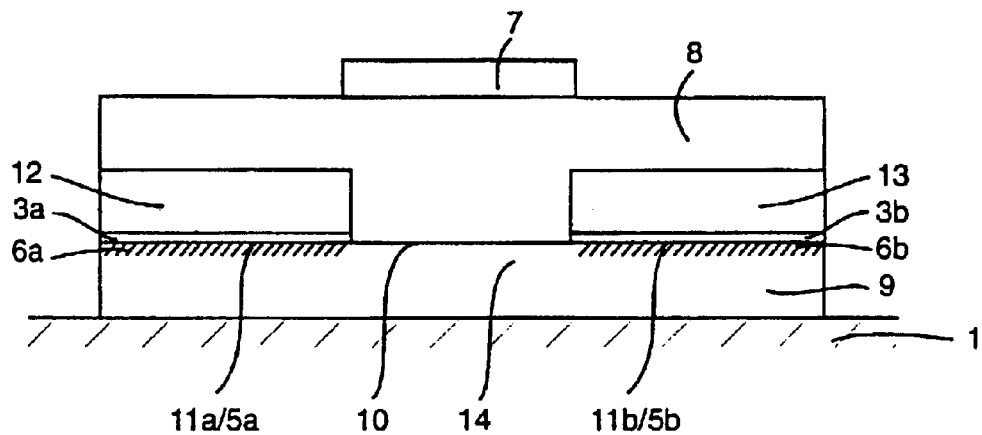
FIGS. 3A–3E are sectional views through various structures of the organic field-effect transistor.

In the case of the configuration shown in FIG. 3A, first, the layer 9 made from an organic semiconductor material was deposited on the substrate 1. On the layer 9, the intermediate layers 3a, 3b containing the dopant are in each case disposed in sections 11a, 11b of the area 10 of the organic semiconductor layer 9 which form the contact areas 5a, 5b. The dopant dopes the layer 9 made of the organic semiconductor material in the regions 6a, 6b adjacent to the contact areas 5a, 5b, while the channel region 14 remains undoped. The source electrode 12 and the drain electrode 13 are disposed as contacts on the sections 11a, 11b. A gate dielectric 8 is applied for the purpose of insulation on the source electrode 12, the drain electrode 13 and also the uncovered area of the layer 9 made of organic semiconductor material, a gate electrode 7 in turn being disposed on the gate dielectric 8.

Figure 3B:
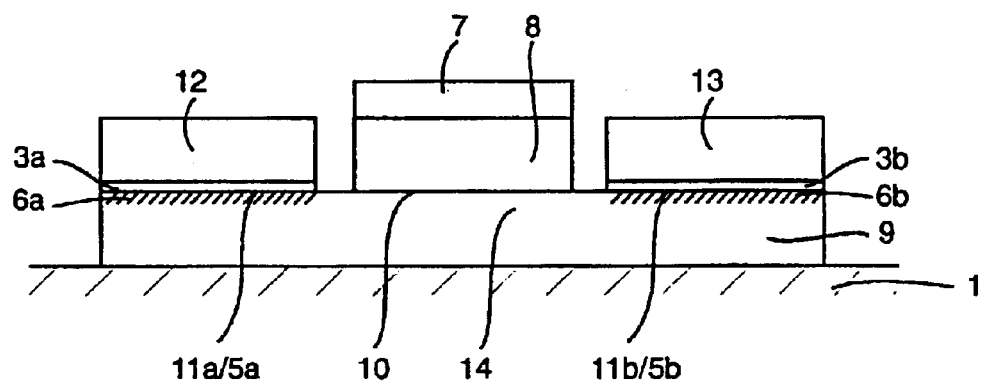

A modification of the field-effect transistor illustrated in FIG. 3A is shown in FIG. 3B. The layer 9 made of organic semiconductor material is disposed on the substrate 1. The intermediate layers 3a, 3b are disposed on the sections 11a, 11b of the area 10 of the layer 9 made of organic semiconductor material, which intermediate layers contain the dopant and introduce a doping in the regions 6a, 6b of the layer 9 made of organic semiconductor material. The source electrode 12 and the drain electrode 13 are disposed as contacts on the sections 11a, 11b. In the region of the channel region 14, the gate dielectric 8 is applied to the layer 9 made of organic semiconductor material, the gate electrode 7 being insulated by the gate dielectric 8.

Figure 3C:
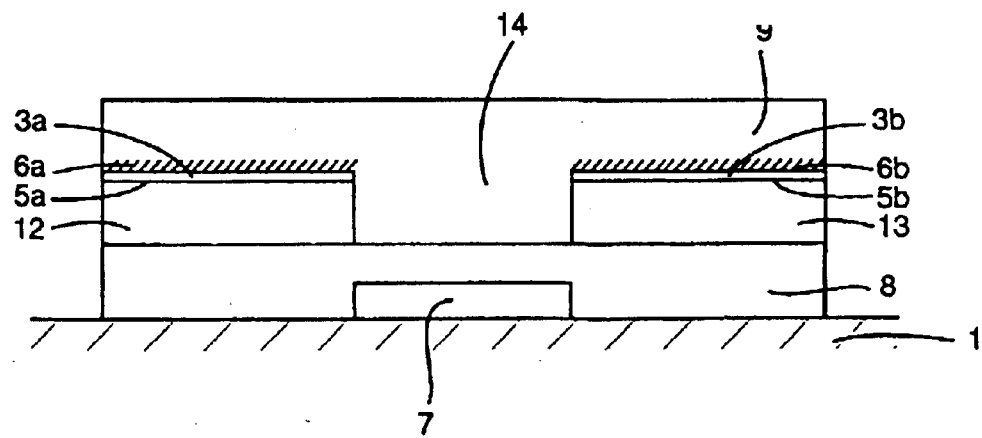
Figure 3D:
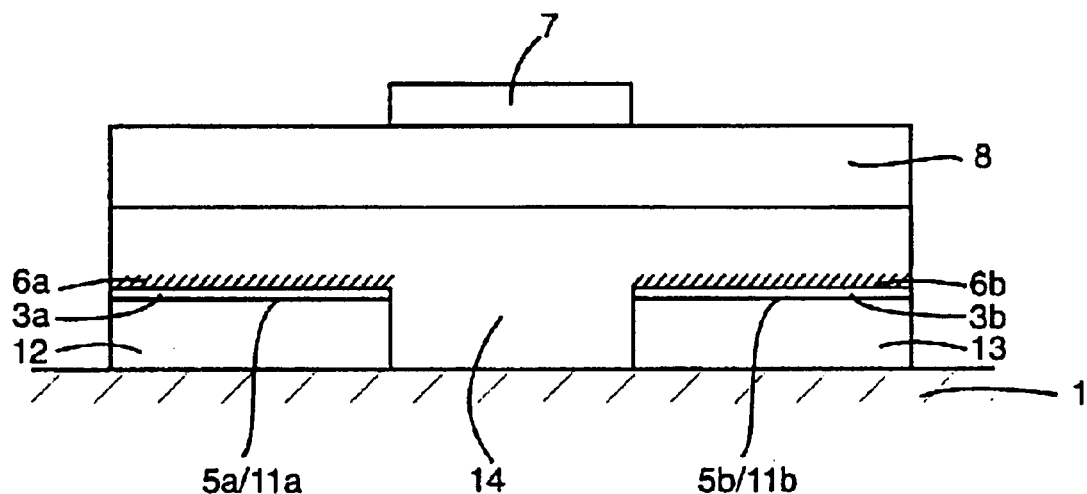

In the field-effect transistors illustrated in FIGS. 3C to 3D, the intermediate layer with the dopant was provided on the contacts during the fabrication of the transistor.

In FIG. 3C, the gate electrode 7 insulated by the gate dielectric 8 is disposed on the substrate 1. The source electrode 12 and the drain electrode 13 are disposed as contacts on the gate dielectric 8 and respectively form contact area 5a, 5b to the layer 9 made of organic semiconductor material which is disposed on the source electrode 12 and the drain electrode 13. The intermediate layers 3a, 3b are disposed at the contact area 5a, 5b, by which intermediate layers a doping was introduced in the regions 6a, 6b of the layer 9 made of organic semiconductor material which are adjacent to the contact areas 5a, 5b. Doping is effected only adjacent to the contact areas 5a, 5b, while the region of the channel region 14 remains undoped, for which reason leakage currents are largely suppressed.

A configuration of a field-effect transistor in which the source electrode 12 and the drain electrode 13 are applied directly on the substrate 1 is shown in FIG. 3D. The intermediate layers 3a, 3b are again disposed on the sections 11a, 11b of the source electrode 12 and of the drain electrode 13, respectively, which form the contact areas 5a, 5b, which intermediate layers contain the dopant and effect a doping in the regions 6a, 6b of the layer 9 made of organic semiconductor material which adjoin the contact areas 5a, 5b. The region of the layer 9 made of organic semiconductor material that is disposed between the source electrode 12 and the drain electrode 13 and which contains the channel region 14 is free of dopings. The gate dielectric 8 is again disposed on the layer 9 made of organic semiconductor material, and the gate electrode 7 is disposed on the gate dielectric.

Figure 3E:
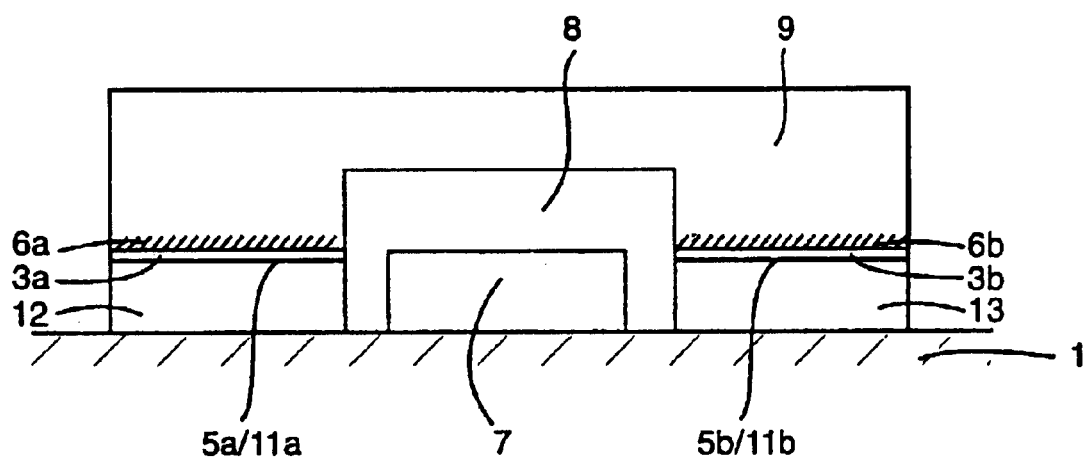

A configuration in which the source electrode 12, the drain electrode 13 and the gate electrode 7 are disposed in one plane is illustrated in FIG. 3E. The thin-film transistor requires only three steps for the deposition of the individual layers and was proposed by H. Klauk, D. J. Gundlach, M. Bonse, C. -C. Kuo and T. N. Jackson, Appl. Phys. Lett. 76, 2000, 1692–1694. First, the source electrode 12, the drain electrode 13 and the gate electrode 7 made of an electrically conductive material, in particular a metal, for example aluminum, are defined on the substrate 1 in a common work step. Afterward, the gate electrode 7 is insulated with the gate dielectric 8. The intermediate layers 3a, 3b containing the dopant are provided on the uncovered sections 11a, 11b of the source electrode 12 and the drain electrode 13 which later form the contact areas 5a, 5b. The layer 9 of the organic semiconductor material is subsequently deposited onto the intermediate layers and also the uncovered areas of the gate dielectric 8. Through the dopant, the regions 6a, 6b that have a doping and thus a higher conductivity are produced in the layer 9 made of organic semiconductor material.

FABRICATION EXAMPLE

Glass coated with indium tin oxide is used as the substrate 1. The surface is cleaned for 15 minutes in acetone and methanol. Afterward, a photoresist is spun onto the indium tin oxide layer at 2500 rpm. The photoresist is exposed through a photomask and developed. The regions of the indium tin oxide that are uncovered after the development of the photoresist are removed in warm hydrobromic acid. The indium tin oxide structures serve as the source and drain contacts 12, 13 and are uncovered by the removal of the photo-resist in acetone. Directly before the application of the organic semiconductor layer, the indium tin oxide contacts are exposed to an oxygen plasma for 5 minutes. During the plasma treatment, a certain quantity of oxygen is absorbed in the indium tin oxide layer. Directly after the plasma treatment, poly(3-octyl)thiophene is spun on as organic semiconductor layer. After the application of the organic semiconductor layer, the oxygen absorbed in the indium tin oxide acts as dopant at the interface between the indium tin oxide contacts and the organic semiconductor layer, as a result of which the contact resistance of the source and drain contacts is considerably reduced.

We claim:

1. A method for fabricating a semiconductor device, which comprises the steps of:

providing a first body;

providing a dopant on at least one section of an area of the first body; and depositing a second body on the section of the area of the first body resulting in a formation of a contact area, one of the first and second bodies formed from an organic semiconductor material and another of the first and second bodies formed from an electrically conductive contact material, a region-selective doping being introduced at the contact area by the dopant into regions of the organic semiconductor material adjoining the contact area.

2. The method according to claim 1, which comprises applying the dopant as a layer on the one section of the area of the first body.

3. The method according to claim 2, which comprises forming the layer as a monomolecular layer.

4. The method according to claim 1, which comprises:

forming the first body from the electrically conductive contact material resulting in the one section of the area of the first body being activated; and forming the second body from the electrically organic semiconductor material, on at least the one section of the area of the first body, to form the contact area between the first and second bodies, and activated sections of the area of the first body introducing a region-selective doping into regions of the organic semiconductor material adjoining the contact area.

5. The method according to claim 4, which comprises doping the first body constructed from the electrically conductive contact material with the dopant, and, after a formation of the contact area, the dopant diffusing from the first body formed from the electrically conductive contact material and is doped with the dopant into regions adjacent to the contact area of the second body constructed from the organic semiconductor material and effecting a stationary doping of the organic semiconductor material in the regions adjoining the contact area.

6. The method according to claim 5, which comprises forming the dopant as an acid and the electrically conductive contact material having strongly basic properties.

7. The method according to claim 1, which comprises forming the dopant as one of a protonic acid and a base which protonates or deprotonates the organic semiconductor material with a salt formation.

8. The method according to claim 1, which comprises forming the dopant as one of an oxidizing agent and a reducing agent for oxidizing or reducing the organic semiconductor material.

9. The method according to claim 1, wherein the dopant has complexing properties.

10. The method according to claim 1, wherein the dopant forms a covalent bond with the organic semiconductor material.

11. The method according to claim 1, wherein the dopant has a group with which the dopant coordinates to sections of the area of the body constructed from the electrically conductive contact material.

12. The method according to claim 4, which comprises applying an at least bifunctional ligand to at least sections of an area of the first body which is constructed from the electrically conductive contact material, the bifunctional ligand having a functional group for coordination to the area of the first body which is constructed from the electrically conductive contact material, and a functional group which coordinates to the dopant, and the dopant being coordinated to the bifunctional ligand.

13. The method according to claim 1, which comprises forming the semiconductor device to be part of an organic field-effect transistor having a source electrode, a drain electrode and a path made of the organic semiconductor material disposed between the source electrode and the drain electrode, at least one of the source electrode and the drain electrode forming the body constructed from the electrically conductive contact material and the path made of the organic semiconductor material forming the body constructed from the organic semiconductor material.

* * * * *